(12) United States Patent
Trout et al.

(10) Patent No.: US 8,964,360 B2
(45) Date of Patent: Feb. 24, 2015

(54) SYSTEM TO CONNECT AND MULTIPLEX SENSOR SIGNALS

(71) Applicants: Jonathan D. Trout, Corona, CA (US); Chet Sandberg, Palo Alto, CA (US)

(72) Inventors: Jonathan D. Trout, Corona, CA (US); Chet Sandberg, Palo Alto, CA (US)

( * ) Notice: Subject to any disclaimer, the term of this patent is extended or adjusted under 35 U.S.C. 154(b) by 0 days.

(21) Appl. No.: 14/166,288

(22) Filed: Jan. 28, 2014

(65) Prior Publication Data

US 2014/0218882 A1 Aug. 7, 2014

Related U.S. Application Data

(60) Provisional application No. 61/761,542, filed on Feb. 6, 2013.

(51) Int. Cl.
 *H02B 1/20* (2006.01)
 *G01R 21/00* (2006.01)
 *G01R 21/06* (2006.01)
 *G01R 1/04* (2006.01)

(52) U.S. Cl.
 CPC .......................................... *G01R 1/04* (2013.01)
 USPC .............. 361/655; 361/656; 700/297; 702/62

(58) Field of Classification Search
 USPC ....................... 361/655, 656; 700/297; 702/62
 See application file for complete search history.

(56) References Cited

U.S. PATENT DOCUMENTS

| | | | | |
|---|---|---|---|---|
| 2,362,372 | A | * | 11/1944 | Halfmann .................... 324/115 |
| 4,794,327 | A | | 12/1988 | Fernandes |
| 4,855,671 | A | | 8/1989 | Fernandes |
| 5,426,360 | A | * | 6/1995 | Maraio et al. ................. 324/126 |
| 5,498,956 | A | * | 3/1996 | Kinney et al. ................. 324/142 |
| 5,502,374 | A | | 3/1996 | Cota |
| 6,236,949 | B1 | * | 5/2001 | Hart ............................... 702/64 |
| 6,330,516 | B1 | | 12/2001 | Kammeter |
| 6,622,097 | B2 | | 9/2003 | Hunter |
| 6,937,003 | B2 | | 8/2005 | Bowman et al. |
| 7,039,532 | B2 | | 5/2006 | Hunter |
| 7,124,655 | B2 | | 10/2006 | Blossfeld |

(Continued)

FOREIGN PATENT DOCUMENTS

| | | | | |
|---|---|---|---|---|
| JP | 05161223 | A | * 6/1993 | ............... H02B 1/40 |
| JP | 2002071734 | A | * 3/2002 | ............. G01R 22/00 |

OTHER PUBLICATIONS

EnerSure iBCPM Product Specification Sheet, Apr. 12, 2013, retrieved from http://www.trendpoint.com/branch-circuit-monitoring/integrated-branch-circuit-meter/.*

*Primary Examiner* — Jeremy C Norris
*Assistant Examiner* — Nathan Milakovich
(74) *Attorney, Agent, or Firm* — Kirk A. Buhler; Buhler & Associates (57) ABSTRACT

Improvements in a system to connect and multiplex sensor signals that connects and multiplexes sensor signals is disclosed. The number of plug connections may line up and match the number of circuit breakers on one side of a panel. The device installs on panel board configurations to gathers precise power information for amps, volts, power factor, watts and kWh—and provides utility-grade data on each branch circuit metering. Up to 4 panel board strips per units of 4, 8 or 21 can be connected together to monitor 120 circuits. The system is adaptable to three phase monitoring and ground fault measurement and monitoring which is not conveniently provided by existing hard wired systems. The number of plug connections may line up with and match the number of circuit breakers on one side of the panel.

20 Claims, 5 Drawing Sheets

(56) References Cited

U.S. PATENT DOCUMENTS

| | | | |
|---|---|---|---|
| 7,174,261 B2 * | 2/2007 | Gunn et al. | 702/62 |
| 7,215,109 B2 | 5/2007 | Angerame et al. | |
| 7,221,145 B2 | 5/2007 | Bowman et al. | |
| 7,234,954 B1 * | 6/2007 | Srage et al. | 439/222 |
| 7,252,543 B2 * | 8/2007 | Caggiano et al. | 439/508 |
| 7,263,450 B2 | 8/2007 | Hunter | |
| 7,309,979 B2 | 12/2007 | Angerame et al. | |
| 7,330,022 B2 | 2/2008 | Bowman et al. | |
| 7,412,338 B2 * | 8/2008 | Wynans et al. | 702/61 |
| 7,453,267 B2 | 11/2008 | Westbrock, Jr. et al. | |
| 7,474,088 B2 | 1/2009 | Bowman et al. | |
| 7,477,501 B2 | 1/2009 | Nelson et al. | |
| 7,493,221 B2 | 2/2009 | Caggiano et al. | |
| 7,546,214 B2 | 6/2009 | Rivers, Jr. et al. | |
| 7,558,651 B2 * | 7/2009 | DeBoer et al. | 700/295 |
| 7,630,863 B2 * | 12/2009 | Zweigle et al. | 702/188 |
| 7,652,871 B2 * | 1/2010 | Caggiano et al. | 361/652 |
| 8,212,548 B2 | 7/2012 | Parker et al. | |
| 8,421,443 B2 | 4/2013 | Bitsch et al. | |
| 8,494,686 B2 | 7/2013 | Masters et al. | |
| 8,560,256 B2 * | 10/2013 | Gu et al. | 702/62 |
| 8,600,695 B2 * | 12/2013 | Cook | 702/107 |
| 8,659,286 B2 * | 2/2014 | Reynolds | 324/117 R |
| 2001/0040446 A1 | 11/2001 | Lapinksi et al. | |
| 2003/0184279 A1 | 10/2003 | Bruno et al. | |
| 2004/0186672 A1 * | 9/2004 | Howell et al. | 702/62 |
| 2004/0254654 A1 | 12/2004 | Donnelly | |
| 2006/0121785 A1 | 6/2006 | Caggiano | |
| 2006/0241880 A1 * | 10/2006 | Forth et al. | 702/60 |
| 2007/0213956 A1 | 9/2007 | Nasle et al. | |
| 2009/0125158 A1 * | 5/2009 | Schweitzer et al. | 700/293 |
| 2009/0228224 A1 * | 9/2009 | Spanier et al. | 702/60 |
| 2010/0002348 A1 * | 1/2010 | Donolo et al. | 361/64 |
| 2010/0020475 A1 * | 1/2010 | Spitaels et al. | 361/656 |
| 2010/0114390 A1 * | 5/2010 | Stevenson et al. | 700/292 |
| 2010/0176960 A1 | 7/2010 | Bitsch et al. | |
| 2010/0207604 A1 * | 8/2010 | Bitsch et al. | 324/140 R |
| 2010/0235122 A1 | 9/2010 | McCrea et al. | |
| 2010/0308792 A1 | 12/2010 | Rupert et al. | |
| 2011/0035065 A1 * | 2/2011 | Schweitzer et al. | 700/286 |
| 2011/0035066 A1 * | 2/2011 | Schweitzer et al. | 700/286 |
| 2011/0035076 A1 * | 2/2011 | Schweitzer et al. | 700/296 |
| 2011/0251732 A1 * | 10/2011 | Schweitzer et al. | 700/297 |
| 2012/0063039 A1 * | 3/2012 | Shah et al. | 361/20 |
| 2012/0271570 A1 * | 10/2012 | Paik et al. | 702/57 |
| 2012/0300348 A1 * | 11/2012 | Franks et al. | 361/42 |
| 2012/0323397 A1 * | 12/2012 | Schweitzer et al. | 700/297 |
| 2013/0147367 A1 * | 6/2013 | Cowburn | 315/152 |
| 2013/0211754 A1 * | 8/2013 | Herzog et al. | 702/62 |
| 2014/0025321 A1 * | 1/2014 | Spanier | 702/62 |

* cited by examiner

SYSTEM TO CONNECT AND MULTIPLEX SENSOR SIGNALS

CROSS REFERENCE TO RELATED APPLICATION

This application claims the benefit of Provisional Application 61/761,542 filed Feb. 6, 2013 the entire contents of which is hereby expressly incorporated by reference herein.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention:

This invention relates to improvements in a system to connect and multiplex sensor signals. More particularly, it is an exemplary embodiment of the invention that uses split core inductive sensors that connect to multiplexable sensor boards to monitor and communicate power loads without requiring the power loads to be de-activated for installation or maintenance of the sensors.

2. Description of Related Art including information disclosed under 37 CFR 1.97 and 1.98:

Electrical distribution panels (e.g. circuit breaker panels) have limited space to install voltage and current sensors necessary for branch circuit monitoring. Running individual wires from each breaker to a central location is complicated and space constrained. Also changing the sensors with different configurations of the breakers is even more complicated. A number of patents and or publications have been made to address these issues. Exemplary examples of patents and or publication that try to address this/these problem(s) are identified and discussed below.

U.S Pat. No. 7,215,109 issued on May 8, 2007 to and U.S. Pat. No. 7,309,979 that issued on Dec. 18, 2007, both to Richard A. Angerame et al., disclose monitoring power at a residence or power consumption point and provide a utility report. While these patents disclose a monitoring and reporting they require that the power is disconnected to tap into the power line and the monitoring devices can't be multiplexed together to provide for a greater number of reading sensors at a specific location.

U.S. Pat. No. 5,502,374 issued on Mar. 26, 1996 to Roger S. Cota discloses current sensors from multiple simultaneous sources. While these sensors monitor the current being consumed by each motor the sensors do not monitor voltage and therefore the power consumption can't be determined. The sensors provide a signal to a single control panel with a fixed number of inputs.

U.S. Pat. No. 4,974,327 issued on Dec. 27, 1988 and U.S. Pat. No. 4,855,671 issued on Aug. 8, 1989, both to Rossevelt A. Fernandes both disclose an electrical parameter power line monitoring apparatus. The apparatus provides a split core monitor. The monitor is placed around each conductor to monitor the power running through the conductor. While these patents cover monitoring the power through a conductor the signals are not multiplexed and are not expandable.

U.S. Pat. No. 6,330,516 issued on Dec. 11, 2001 to John B. Kammeter discloses a branch circuit monitor. The branch circuit monitor includes a plurality of non-contact current sensors arranges to sense current on each of the plurality of branch circuits. While this patent discloses branch circuit monitoring the signals are not multiplexed and are not expandable to monitor additional circuits.

What is needed is a system to connect and multiplex sensor signals. The system should also be adapted to three phase monitoring and ground fault measurement and monitoring which is not conveniently provided by existing hard wired systems. The system should be adaptable to different types of sensors which existing solutions do not. This disclosure provides the solution that is not being provided by other available or disclosed devices.

BRIEF SUMMARY OF THE INVENTION

It is an object of the system to connect and multiplex sensor signals to install on any panel board configuration where the device gathers precise power information for amps, volts, power factor, watts and kWh—and is certified to provide utility-grade data on each branch circuit metering.

It is an object of the system to connect and multiplex sensor signals to monitor power metrics from the iBCPM can integrate with any BMS or DCIM system via Modbus TCP, SNMP or BACnetIP. The system is powered by a TrendPoint xD processor for the iBCPM to provide data and event logging as a standard feature.

It is an object of the system to connect and multiplex sensor signals for the EnerSure iBCPM to be part of an EnerSure platform of products that provides the most accurate, flexible, and adaptable power metering solutions in the market and is used in some of the most prestigious facilities in the world.

It is another object of the system to connect and multiplex sensor signals for the EnerSure® iBCPM panel board strip to be linked with EnerSure Bus cards to provide additional monitoring up to 120 circuits on a single iBCPM system. Additional circuits can be added in 4 or 8 circuit groups.

It is another object of the system to connect and multiplex sensor signals for the EnerSure iBCPM to employ 21 power meter-on-a-chip units on each panelboard strip. Up to 4 panel board strips per units can be connected together to, each EnerSure iBCPM thereby to accommodate up to 84 circuits of utility grade panelboard power data.

It is still another object of the system to connect and multiplex sensor signals for the system to be adaptable to three phase monitoring and ground fault measurement and monitoring which is not conveniently provided by existing hard wired systems. The system should be adaptable to different types of sensors which existing solutions do not. The number of plug connections may line up with and match the number of circuit breakers on one side of the panel.

Various objects, features, aspects, and advantages of the present invention will become more apparent from the following detailed description of preferred embodiments of the invention, along with the accompanying drawings in which like numerals represent like components.

DETAILED DESCRIPTION OF THE INVENTION

Figure 1:
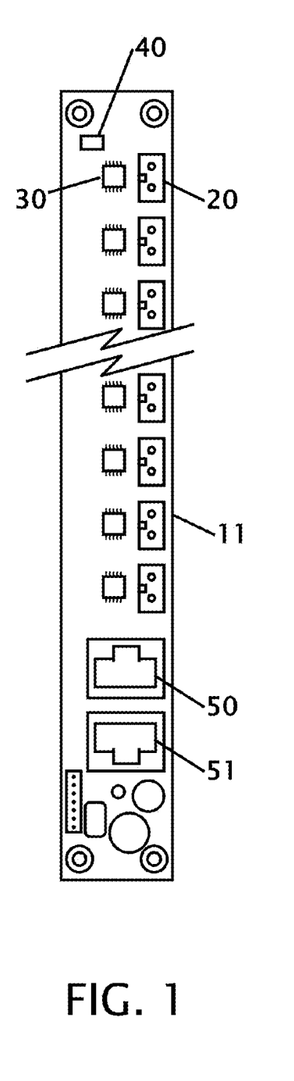
FIG. 1 shows a top view of the iBCPM panel board strip.
Figure 2:
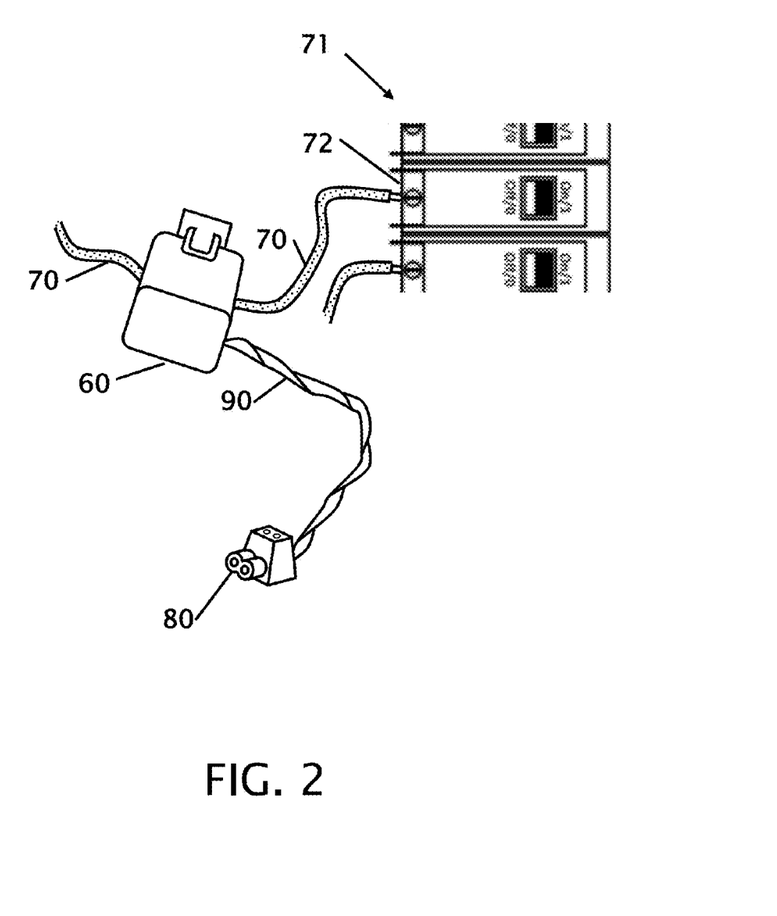
FIG. 2 shows a perspective view of a circuit breaker with a current transformer.

FIG. 1 shows a top view of the iBCPM panel board strip, FIG. 2 shows a perspective view of a circuit breaker with a current transformer. Electrical distribution panels 71 (e.g. circuit breaker 72 panels) have limited space to install voltage and current sensors necessary for a branch circuit monitoring. Running individual wires 70 from each breaker 72 to a central location is complicated and space constrained. Also changing the sensors with different configurations of the breakers 72 is even more complicated. This system allows multiplexing of sensors (e.g. current sensors 60) and changing the sensors while the panel 71 is energized. It also allows different types of sensors (current, temperature, voltage etc.) to be used on the same multiplexing system.

Existing systems are hard wired and necessitate de-energizing the panel 72 for modification for current sensors 60. This system gives the user the ability to plug and play sensors of different sensitivity. It also allows multiple sensors on the same breaker. Existing systems don not allow energized replacement of modification of sensors. The number of plug connections 20 may line up with and match the number of circuit breakers 72 on one side of the panel 71.

In this embodiment the circuit board(s) 11 include multiple plug and play connections 20 for multiplexing signals from sensors 60 that may match in number and spacing with circuit breakers 72 in most panels 71. Connector(s) 20 are for input from sensor 60. Each circuit board 11 includes an integrated circuit 30 for converting sensing input to digital multiplexed output. A power input 40 supplies power to the board assembly 11. Information from the conversion integrated circuits 30 are communicated through a multiplexed single output 50. A second multiplexed signal output 51 allows for multiple circuit boards 11 to be multiplexed to monitor more than the number of current sensors 60 that can be connect to a single circuit board 11. It is contemplated that four circuit boards 11 can be connected together to monitor 84 current sensors 60.

Figure 3:
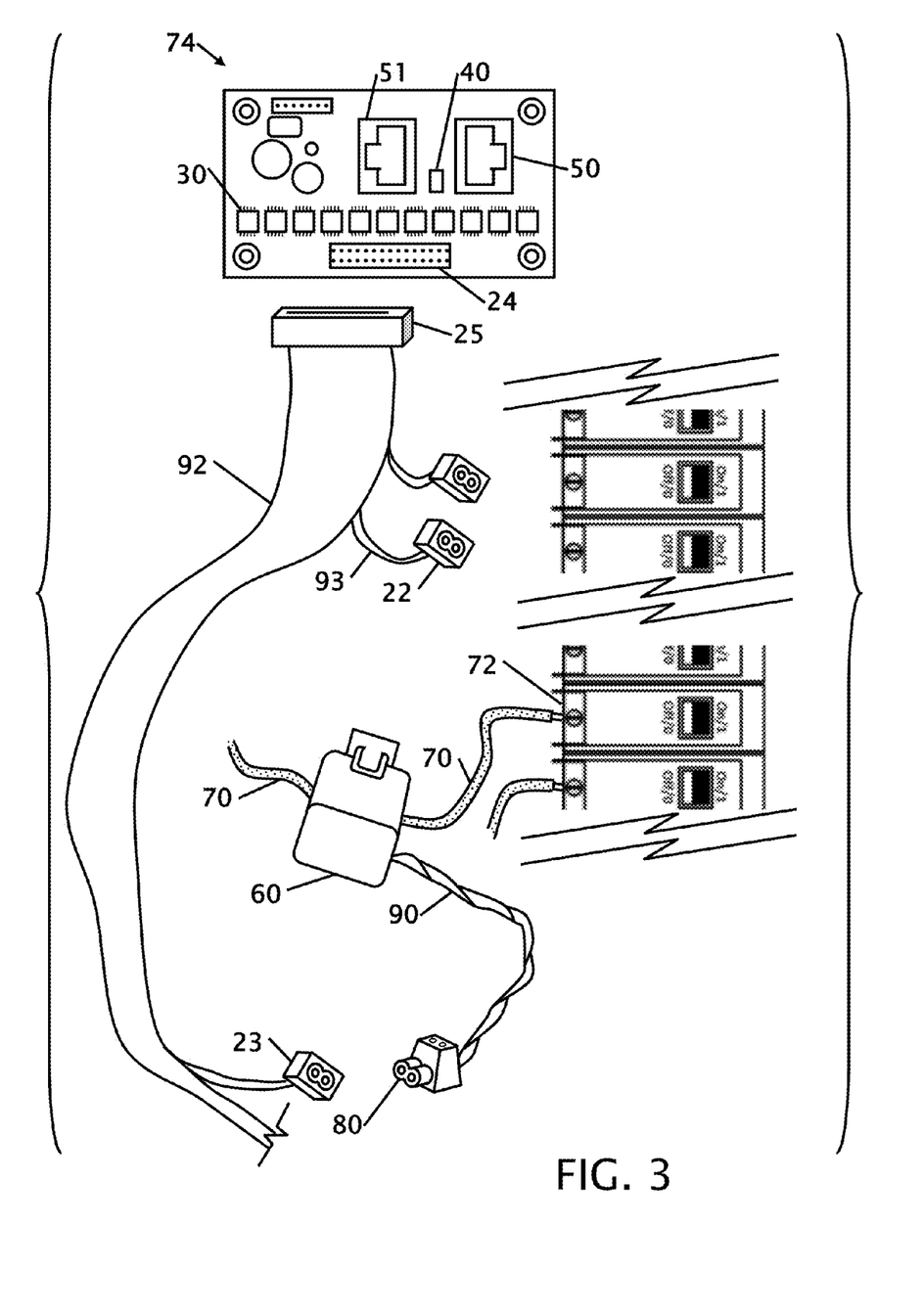
FIG. 3 shows a second embodiment where a cable with connectors has sockets for the current transformers.
Figure 4:
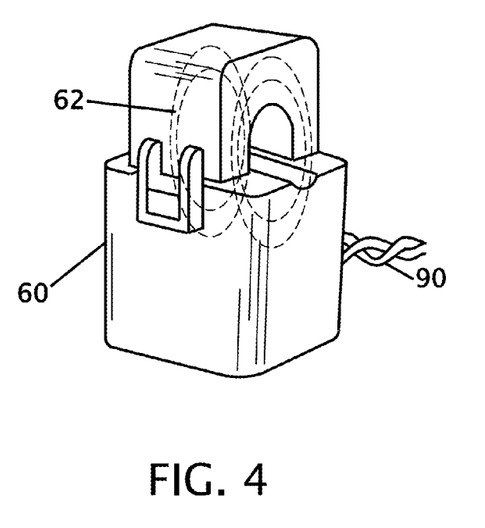
FIG. 4 shows perspective view of a first embodiment of a current transformer.

In these figures the sensor component 60 is an example of a split core current sensing toroid that is shown in FIGS. 3 and 4. Primary wire 70 connects from the breaker 72 through the split core current sensing 60 and then to the load. The split core current sensing 60 connects with secondary wires 90 through connector 80 into one of the plug and play sockets 20 on the circuit board 11. The split core current sensing 60 is a split in toroid core for attachment to 70 while panel 71 is energized.

Relationship Between The Components:

The current measuring system 60, 70, 80, 90 measures the current through circuit breaker conductor 72. The circuit board 11 and components 20, 30, 40, 50 and 51 takes a number of current sensor 60 (or other sensor) inputs through the plug(s) 80 in socket(s) 20 on the board 11 and changes the analog signal of each to a digital signal and sends this information through the output connections 50, 51 through connected wires to a central monitoring device.

FIG. 3 shows a second embodiment where a cable with connectors has sockets for the current transformers. In this embodiment the circuit board 74 and a connector 24 that receives an interconnecting cable 92 with a mating connector 25 on one end and a plurality of sockets 22, 23 connected with a portion 93 of the cable 92 where the split core current sensing 60 connects 80. The plurality of sockets 22, 23 essentially align with the circuit breakers 72.

Figure 5:
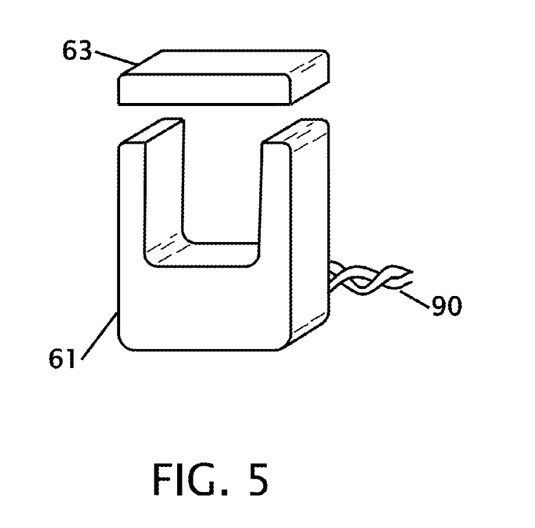
FIG. 5 shows perspective view of a second embodiment of a current transformer.

FIG. 4 shows perspective view of a first embodiment of a current transformer 60 and FIG. 5 shows perspective view of a second embodiment of a current transformer 61. The split core current sensors 60 and/or 61 connect with secondary wires 90 through a connector and plug into one of the plug and play sockets 20 on the circuit board 11 (from FIG. 1). The split core current sensors 60 and/or 61 is a split in toroid core. The current transformer 61 is shown with the top 63 of the of the split core removed.

Figure 6:
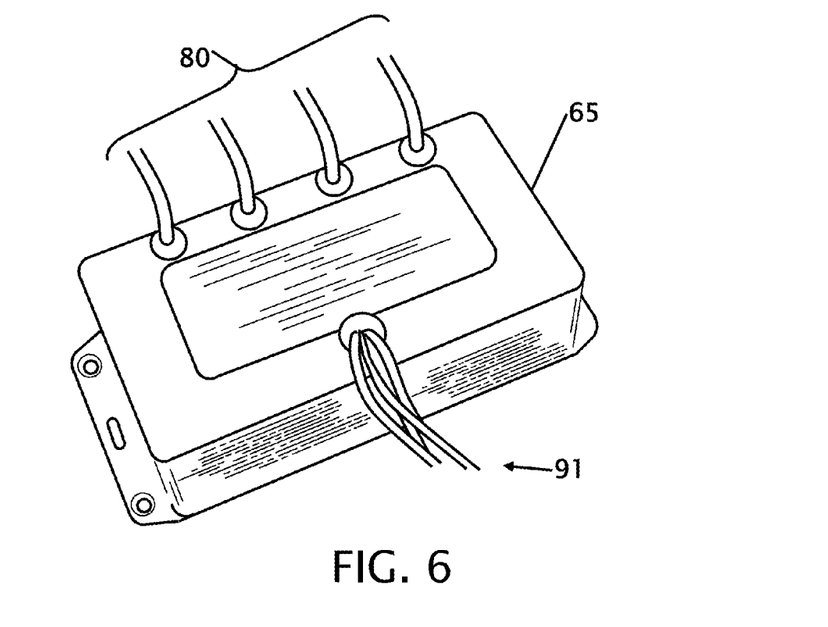
FIG. 6 shows a perspective view of a potential transformer.

FIG. 6 shows a perspective view of a potential transformer 65. The potential transformer 65 has connections 81 for multiple wires from a three phase device to calculate the current and voltage to determine the potential power useage and communicate through connectors 91.

Figure 7:
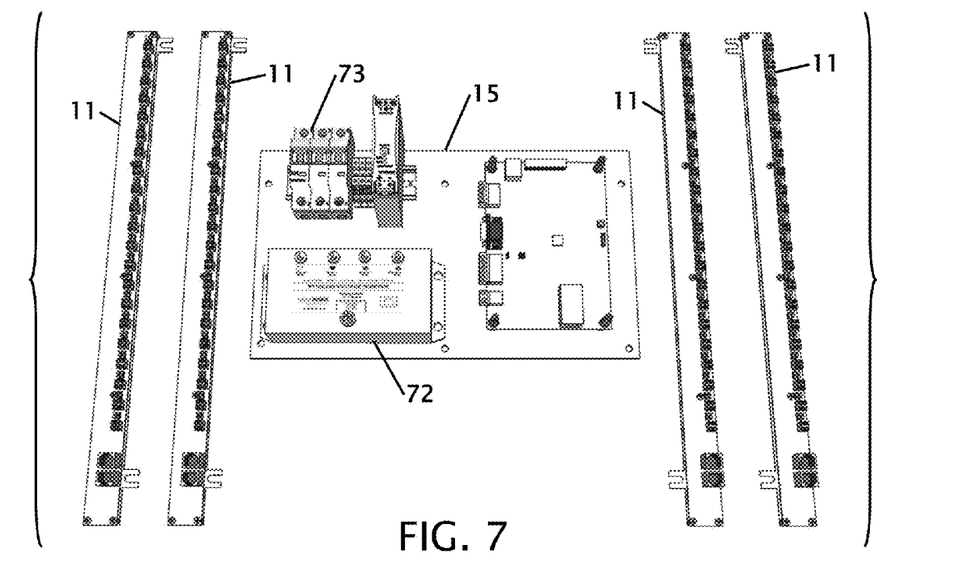
FIG. 7 shows a perspective view of an iBCPM metering system for 84 circuits.

How The System Operates:

FIG. 7 shows a perspective view of an iBCPM metering system for 84 circuits. One key to the system is the ability to configure different current sensors (of different sensitivity or in fact other sensor types, e.g. ground fault) conveniently and while the panel is energized. Also a panel board 15 may be reconfigured from single phase to 3 phase or circuit breakers of different capacity may be installed. This system lets the installation precede in a much quicker fashion and at much less expense. It also allows replacement of failed sensor components without disturbing the primary wiring 70 to circuit breakers 72 or 73. Expert imbedded software on board 11 in component 30 will be used to condition the analog signal and convert it to digital.

How To Make The System:

Standard electrical and electronic components are assembled to make this invention. The board may be a printed circuit board of high quality. Optional components may be the number of sensors installed. Blank input sockets may be saved for future sensor installation. The board size can be from a few input channels to many. A typical 21 circuit input board 11 would match one side of a typical 42 position breaker panel. Input sensors can be changed as mentioned above. Different sensors of temperature, ground leakage, ground fault, voltage, amps, volts, vibration, leak, power factor, watts, three phase voltage, three phase amps, three phase power and kWh and humidity are all examples of different input sensors that can be used. Also tow current sensors of different sensitivity can be used. For instance a 1 to 50 amp current sensor can be combined on a separate channel with a low current high sensitivity 0.001 amp to 1 amp sensor. The various input types can use a look-up table or mathematical conversion to determine, display and or output an output in known units.

How To Use The System:

One key to the system is the ability to configure different current sensors (of different sensitivity or in fact either sensor types, e.g. ground fault) conveniently and while the panel is energized. Also a panel board may be reconfigured from single phase to 3 phase or circuit breakers of different capacity may be installed. This system lets the installation precede in a much quicker fashion and at much less expense. It also allows replacement of failed sensor components without disturbing the primary wiring. While this system was inspired for branch circuit monitoring in data centers, it can be used for any facility that needs branch circuit monitoring. For instance, hospitals, laboratories and office buildings could use this system.

Figure 8:
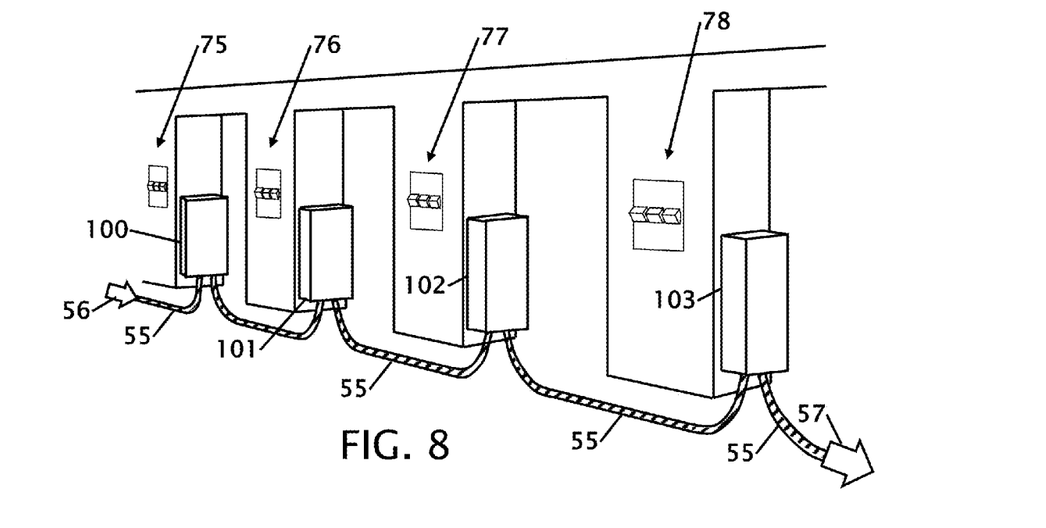
FIG. 8 shows a connection for multiple power breakers with an interconnecting bus that supports multiple busway power meters.

FIG. 8 shows a connection for multiple power breakers with an interconnecting bus 55 that supports multiple busway power meters 100-103 using busway power meters (that are shown and described in more detail in FIGS. 8 and 9) that connect with one or multiple electrical distribution panels 75-78. The multiple busway power meters 100-103 are connected with a daisy chained Ethernet connection 55 that connects into 56 and out 57 of chained multiple busway power meters 100-103.

The EnerSure iBCPM's pluggable CT design allows users to vary the CTs used in the system. CTs can be added or removed after the system is deployed and are available in any size from 75 and 300 amp series to 4000 amps. Onboard Ethernes allows the EnerSure® iBCPM to provide all standard forms of data connectivity without the need for gateways or additional hardware. The open protocols allow EnerSure® iBCPM to be easily integrated into any DCIM and/or Building Management System (BMS). The iBCPM supports concurrent sessions across multiple software systems.

Data logging and event logging is provided with 9 onboard data logs can record 120 data points each with intervals as fast as 30 seconds. Using a standard microSD card, users can record thousands of time-stamped data points. The data logs can be downloaded as a .CSV file or delivered using Modbus TCP and BACnetIP protocols. The onboard event logs record alarm indications for sequence of events correlation.

EnerSure® iBCPM allows you to manage your circuit amperage capacities with greater reliability. Our CTs are 0.5% accurate from 1 to 100% of the scale, giving you more visibility into your usage. The system has the ability to provide both L-N and L-L voltage readings on individual circuits, EnerSure® iBCPM allows measurement of voltage in various configurations.

Power factor is measure at the circuit level. The system and software measures power factor on each circuit and provides the ability to detect troubled equipment and energy waste.

Wattage is the true measurement of heat. By associating each circuit with the cabinet or rack that it feeds, the actual wattage of heat in each cabinet and adjust loads as necessary.

kWh energy charge backs and related carbon emission reporting are increasing. Laws such as California Public Utilities Commission 07-09-004 require that any charge back for power usage MUST be done with meters that meet a utility grade standard at the individual circuit level.

Figure 9:
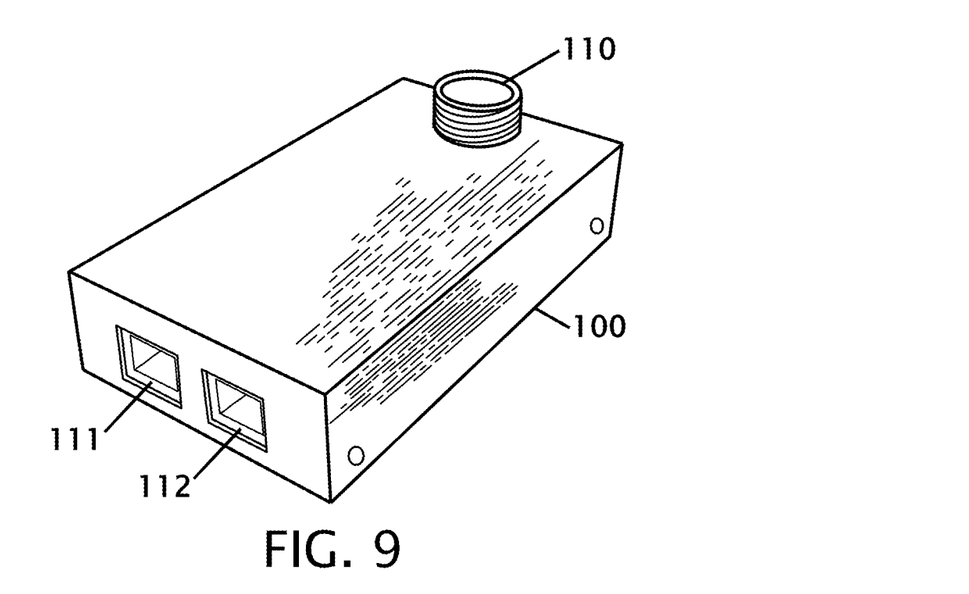
FIG. 9 shows a closed circuit metering unit from FIG. 8.
Figure 10:
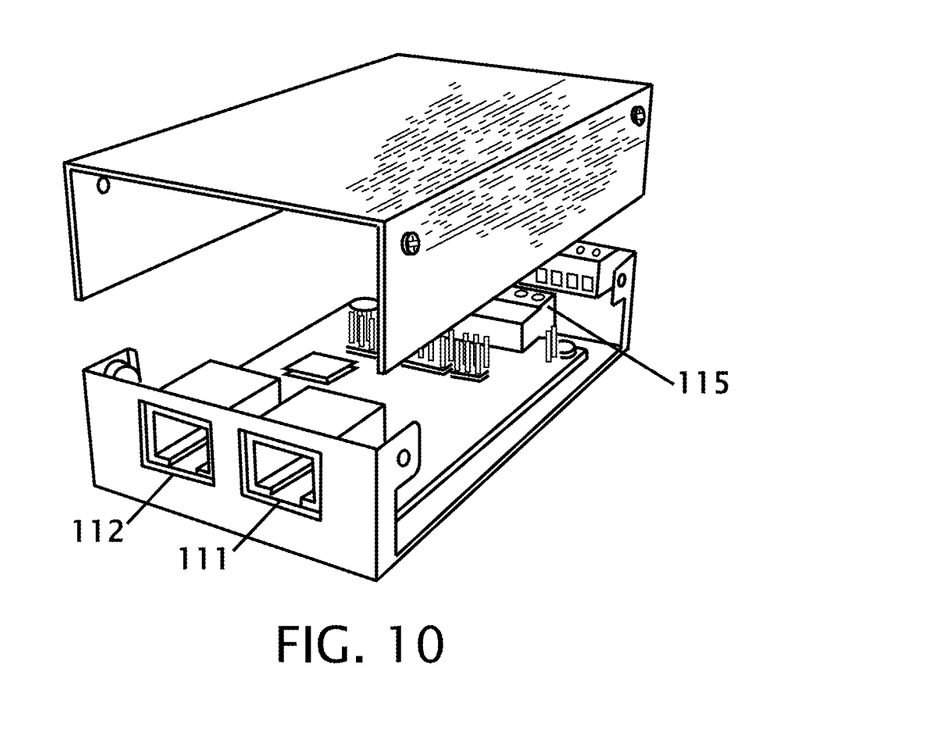
FIG. 10 shows an opened circuit metering unit from FIG. 5.

FIG. 9 shows a closed circuit metering unit 100 from FIG. 8 and FIG. 10 shows an opened circuit metering unit 100 from FIG. 5. The circuit metering unit 100 has a feed through 110 for current transformer (CT) wires. Within the circuit metering unit 100 a connector 115 provides connection for the current transformer wires. Each circuit metering unit 100 provides an RS-485 bus or cambus connection for connecting to processor card that includes, but is not limited to, power and communications. Each circuit metering unit 100 also has a connection 112 for connection to additional circuit metering units 100 over an RS-485 bus or cambus.

Thus, specific embodiments of a system to connect and multiplex sensor signals have been disclosed. It should be apparent, however, to those skilled in the art that many more modifications besides those described are possible without departing from the inventive concepts herein. The inventive subject matter, therefore, is not to be restricted except in the spirit of the appended claims.

The invention claimed is:

1. A system to connect and multiplex sensor signals comprising:
    a multiplex board;
    said multiplex board having a plurality of connectors for input from at least one sensor;
    one of said at least one sensor being a current sensor;
    said current sensor coupled to a conductor without requiring power interruption through said conductor when said current sensor is installed, removed or replaced on said conductor;
    said current sensor connects with secondary wiring from said current sensor to said input;
    said input is a socket on said multiplex board;
    said socket connects to a converter on said multiplex board to convert an analog signal from said current sensor to a digital signal, and
    said multiplex board has at least one communication connector that connects said multiplex board with an integrated communication network to a monitoring system.

2. The system to connect and multiplex sensor signals according to claim 1 wherein said multiplex board further includes at least a second communication connector that allows connection to at least a second multiplex board.

3. The system to connect and multiplex sensor according to claim 2 that allows multiple multiplex boards to monitor at least 120 circuits.

4. The system to connect and multiplex sensor signals according to claim 1 wherein said multiplex board includes 21 input connections are configured in an elongated strip for said 21 sensors to align with circuit breakers within an electrical panel.

5. The system to connect and multiplex sensor signals according to claim 1 wherein said integrated communication network is a RS-485 bus or cambus.

6. The system to connect and multiplex sensor signals according to claim 1 wherein said plurality of connectors allow connection for one or more measurements selected from the group consisting of temperature, ground leakage, ground fault, voltage, amps, volts, vibration, leak, power factor, watts, three phase voltage, three phase amps, three phase power, kWh and humidity.

7. The system to connect and multiplex sensor signals according to claim 1 wherein said monitoring system is at least one of a group consisting of building management system or data center infrastructure system, data logging and event logging.

8. The system to connect and multiplex sensor signals according to claim 7 wherein said data logging and event logging records at least 120 data points for intervals of at least 30 seconds.

9. The system to connect and multiplex sensor signals according to claim 1 wherein said current sensor measures current between 0.001 amps and 4000 amps.

10. The system to connect and multiplex sensor according to claim 1 wherein said at least one sensor is removable and replaceable from said conductor and said multiplex board without removing power to said multiplex board.

11. A system to connect and multiplex sensor signals comprising:
- a multiplex board;
- said multiplex board having a connector for a wiring harness for a plurality of connections for input from at least one sensor;
- one of said at least one sensors is a current sensor;
- said current sensor coupled to a conductor without requiring power interruption through said conductor when said current sensor is installed, removed or replaced on said conductor;
- said current sensor connects with said wiring harness that connects to said multiplex board;
- said connect on said multiplex board has multiple converters that discretely converts signals from said at least one sensor to a digital signal, and
- said multiplex board has at least one communication connector that connects said multiplex board to an integrated communication network then to a monitoring system.

12. The system to connect and multiplex sensor signals according to claim 11 wherein said multiplex board further includes at least a second communication connector that allows connection to at least a second multiplex board.

13. The system to connect and multiplex sensor signals according to claim 12 that allows for multiple multiplex boards to monitor at least 120 circuits.

14. The system to connect and multiplex sensor signals according to claim 11 wherein said multiplex board includes 21 input connections are configured along said wiring harness for said 21 sensors to align with circuit breakers within an electrical panel.

15. The system to connect and multiplex sensor signals according to claim 11 wherein said integrated communication network is a RS-485 bus or cambus.

16. The system to connect and multiplex sensor signals according to claim 11 wherein said plurality of connections allow connection for one or more measurements selected from the group consisting of temperature, ground leakage, ground fault, voltage, amps, volts, vibration, leak, power factor, watts, three phase voltage, three phase amps, three phase power, kWh and humidity.

17. The system to connect and multiplex sensor signals according to claim 11 wherein said monitoring system is at least one of a group consisting of building management system or data center infrastructure system, data logging and event logging.

18. The system to connect and multiplex sensor signals according to claim 17 wherein said data logging and event logging records at least 120 data points for intervals of at least 30 seconds.

19. The system to connect and multiplex sensor signals according to claim 11 wherein said current sensor measures current between 0.001 amps and 4000 amps.

20. The system to connect and multiplex sensor according to claim 11 wherein said at least one sensor is removable and replaceable without removing power to said multiplex board.

* * * * *